(12) United States Patent
Burden et al.

(10) Patent No.: US 6,691,285 B1
(45) Date of Patent: Feb. 10, 2004

(54) EXPONENTIAL INCREMENTS IN FET SIZE SELECTION

(75) Inventors: David C. Burden, Fort Collins, CO (US); Dave Anderson, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 9 days.

(21) Appl. No.: 10/229,535

(22) Filed: Aug. 27, 2002

(51) Int. Cl.[7] ............................................. G06F 17/50
(52) U.S. Cl. .................. 716/2; 716/4; 716/5; 716/6; 716/7; 716/8; 716/9; 716/10
(58) Field of Search ........................................ 716/4–10

(56) References Cited

U.S. PATENT DOCUMENTS

| | | | | |
|---|---|---|---|---|
| 6,260,177 B1 | * | 7/2001 | Lee et al. ........................ | 716/2 |
| 6,367,055 B1 | * | 4/2002 | McBride ........................ | 716/4 |
| 6,434,724 B1 | * | 8/2002 | Chang et al. .................. | 716/4 |
| 6,550,040 B1 | * | 4/2003 | Keller et al. .................... | 716/4 |
| 6,594,594 B1 | * | 7/2003 | Tsai ............................ | 702/65 |
| 6,606,733 B2 | * | 8/2003 | Keller et al. .................... | 716/4 |
| 6,637,018 B1 | * | 10/2003 | Demler ........................ | 716/18 |
| 2003/0070147 A1 | * | 4/2003 | Friend et al. .................. | 716/2 |
| 2003/0188268 A1 | * | 10/2003 | Konstadinidis et al. ........ | 716/2 |

* cited by examiner

Primary Examiner—Matthew Smith
Assistant Examiner—Andrea Liu
(74) Attorney, Agent, or Firm—Alexander J. Neudeck

(57) ABSTRACT

A set of discrete transistor sizes spread in an exponential manner over a specified range is the basis for adjusted transistor sizes used to optimize a circuit. One of the discrete transistor sizes may be the original transistor size or other starting point for the optimization.

26 Claims, 2 Drawing Sheets

EXPONENTIAL INCREMENTS IN FET SIZE SELECTION

FIELD OF THE INVENTION

This invention relates generally to computerized optimization of electronic circuits and more particularly to the selection of various field-effect transistor (FET) width-to-length ratios or bipolar transistor areas for circuit optimization.

BACKGROUND OF THE INVENTION

Computerized optimization of electronic circuits may involve adjusting a set of circuit parameters (i.e. resistor values, FET sizes, etc.), running a simulation to see if the new values have improved a performance parameter (i.e. bandwidth, amplification, circuit delay), and selecting a new set of parameters based upon the results of the simulation and some search algorithm. This process may continue until a desired result is achieved (i.e. the performance parameter reaches or exceeds a certain value) or until all of a set of circuit parameters has been tried (i.e. an exhaustive search).

Typically, when optimizing a circuit for use on an integrated circuit, the primary circuit parameters that may be adjusted are the sizes (i.e. the width-to-length ratios of the FETs, or the area of the bipolar transistors) of the transistors in the circuit. Some of the methods for picking adjusted sizes for a transistor include picking a totally random value from a specified range or picking a size that is linearly different from the original value resulting in a set of values that may be evaluated that is linearly distributed a specified range. One problem with picking a random transistor size is that a large number of random values may need to be evaluated before an optimal value is found. Also, using random values may yield a different result each time the optimization is run so this method does not necessarily produce a deterministic result. One problem with picking a value that differs linearly from the original value is that it may take a great number of iterations to reach an optimal value that lies far from the initial transistor size.

SUMMARY OF THE INVENTION

A set of discrete transistor sizes spread in an exponential manner over a specified range is the basis for adjusted transistor sizes used to optimize a circuit. One of the discrete transistor sizes may be the original transistor size or other starting point for the optimization.

DETAILED DESCRIPTION OF THE PREFERRED EMBODIMENTS

Figure 1:
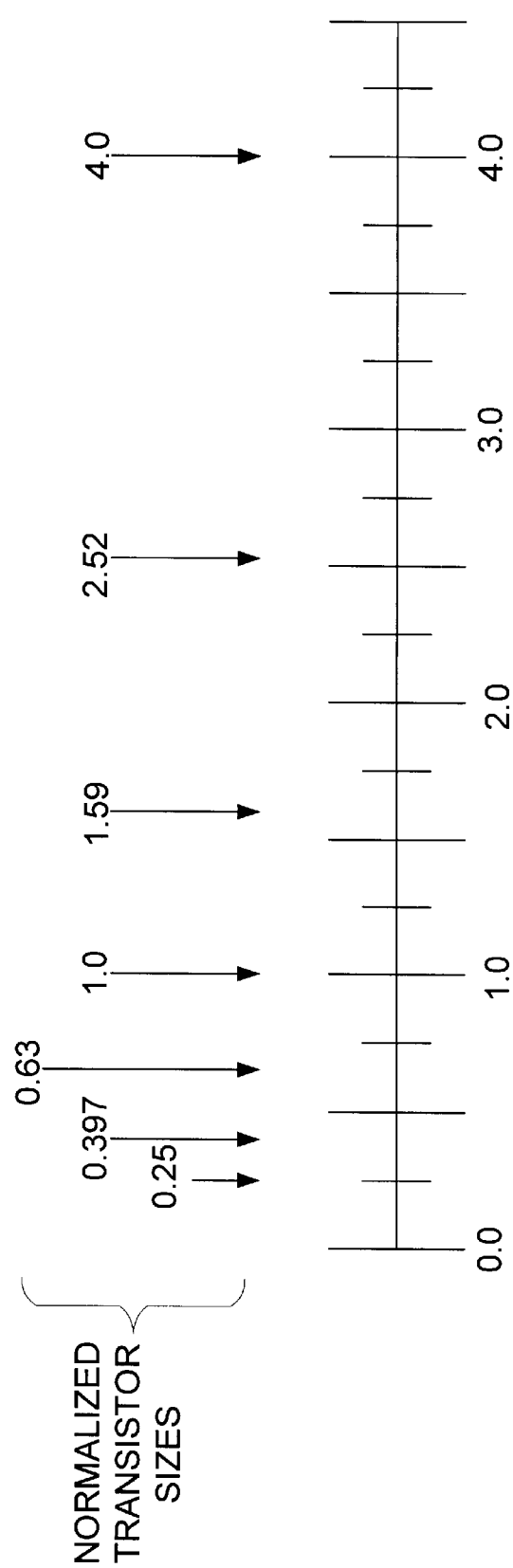
FIG. 1 is an illustration of a normalized sample set of discrete transistor sizes with a range factor of 4.

A typical circuit optimization program is run on a computer and stored on a computer readable medium. A circuit topology and initial transistor sizes or other circuit parameters are given as input to the circuit optimization program. The circuit optimization program then follows a search or other optimization algorithm to optimize a particular performance parameter of the circuit. While performing its optimization algorithm, the circuit optimization program may need to choose a different size or sizes for a transistor or transistors. To do this, in an embodiment of the invention transistor sizes are picked such that they are spread over a predetermined range in an exponential manner. FIG. 1 gives an example of seven sizes spread over the range 0.25 to 4.0 in an exponential manner. This sample set is referred to as normalized since the size that has an equal number of other discrete sizes greater than and less than is 1.0. Accordingly, the FET size of 1.0 may be multiplied by a different original or other starting FET size value to produce a set of discrete FET sizes for that different original or other starting FET size. Likewise, the bipolar transistor area of 1.0 may be multiplied by a different original or other starting bipolar transistor size value to produce a set of discrete bipolar transistor sizes for that different original or other starting bipolar transistor size. The data used to generate FIG. 1 is given in table 1, below.

TABLE 1

| n | $4^{(\frac{2n}{6}-1)}$ |
|---|---|
| 0 | 0.25 |
| 1 | 0.397 |
| 2 | 0.63 |
| 3 | 1.0 |
| 4 | 1.59 |
| 5 | 2.52 |
| 6 | 4.0 |

Table 1 was generated from equation 1 with A=1.0, R=4.0, and s=7.

$$W = A \cdot R^{(\frac{2n}{s-1}-1)}$$  Equation 1.

In Equation 1, W is the size of a transistor in the distribution. This may be a FET width-to-length ratio, or a bipolar transistor area. A is a nominal size value around which there will be an equal number of sizes greater than A, and less than A. Once again, this may be a FET width-to-length ratio, or a bipolar transistor area. R is a range factor that determines, in relation to A, the smallest and largest values of the distribution. In the example of FIG. 1 and Table 1, since R=4, then the smallest value will be (¼)*A and the largest, 4*A. If an R=2 were chosen, then the smallest value would be (½)*A and the largest, 2*A. S is the total number of FET sizes in the distribution. In the example of FIG. 1 and Table 1, S=7 so there are seven total transistor sizes in the distribution. These sizes break down as follows: three sizes that are less than A; three sizes greater than A, and A—a total of seven. Accordingly, to include the original, or starting point size, s should be chosen to be odd. If it is not desired to include the original, or starting point size, then s may be chosen to be even. An integer index, n, that runs from zero to s−1 is used to generate or select a member of the transistor size distribution. Note that since n is in the exponent of R, the sizes generated by Equation 1 lie along an exponential curve when plotted versus n.

Figure 2:
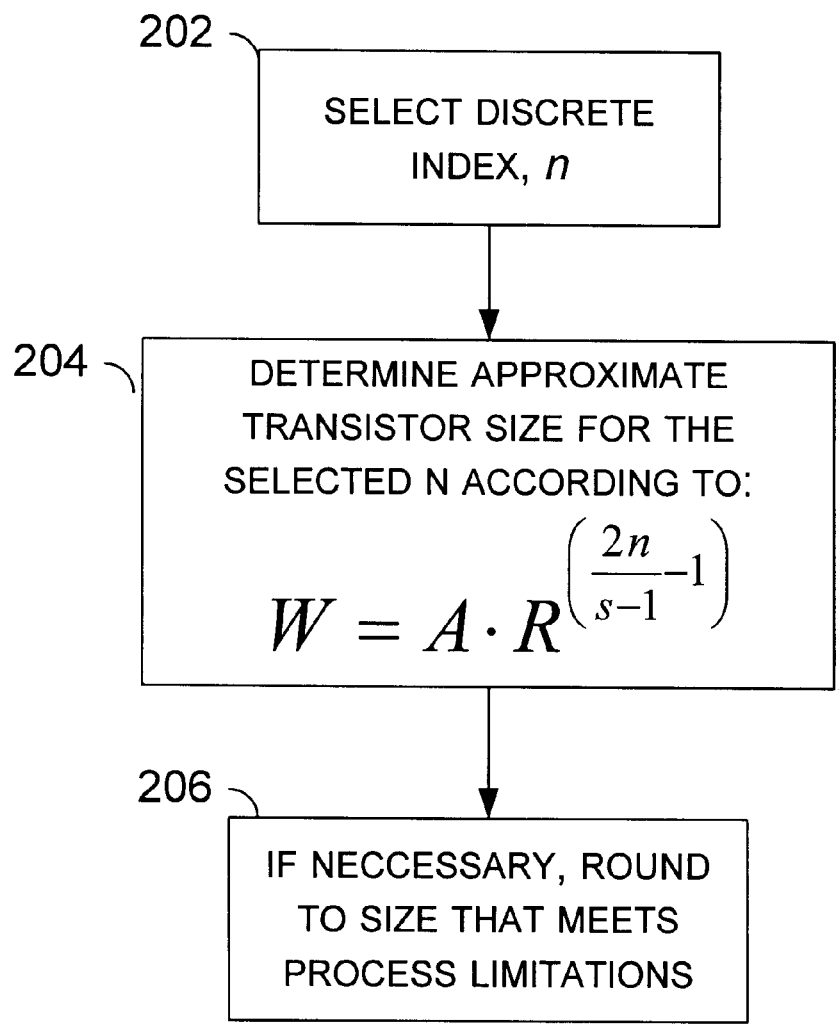
FIG. 2 is a flowchart illustrating steps for exponential picking of discrete transistor sizes.

FIG. 2 is a flowchart illustrating steps for exponential picking of discrete transistor sizes. In a step 202, a discrete index, n, is selected. How n is selected depends upon the particular optimization algorithm being employed. For example, an exhaustive search may start with n=0 and proceed through each integer until n=s−1. Another example may randomly select n from the range 0 to s−1. Finally, a search algorithm, such as a binary search, may be used to select n. One skilled in the art will readily recognize that many different methods known in the art may be used to select or perform the equivalent of a selection for a value for n.

In one embodiment, the optimization algorithm used is called the genetic algorithm. The genetic algorithm seeks to optimize a list of characteristics against some performance benchmark. This list of characteristics is commonly referred to as a chromosome, and the individual characteristics as genes. The genetic algorithm will randomly assign each gene in the chromosome to a value from a predetermined set, and then evaluate that chromosome on the performance benchmark. After evaluating some number of random chromosomes, it will take the best two and "mate" them several times, creating a new set of chromosomes to evaluate. Once further mating cycles no longer produce better results, a cataclysm will be introduced, "killing" all but one of the existing chromosomes, and replacing them with new, random chromosomes. Once one or two cataclysms fail to produce a better chromosome, the algorithm is complete.

In this scheme, the invention is used to create the predetermined set of valid gene values. In one embodiment, the values are FET widths, and the performance benchmark is a function of the speed and power consumption of the circuit implied by each chromosome.

Regardless of the optimization or search algorithm chosen, it is clear to one skilled in the art that performing a linear search over an arbitrarily large search space will be significantly less efficient than performing a search of the discrete values produced by an embodiment of the invention.

In a step 204, an approximate transistor size is determined for the selected n according to Equation 1. In a step 206, if necessary, the approximate transistor size determined in step 204 is rounded. 100161 Many typical integrated circuit fabrication processes require that certain feature geometries, such as FET widths and lengths and therefore FET size, be limited to a minimum increment. For example, a process may require that FET widths can only be adjusted in 0.1 um increments. Therefore, a 1.15 um FET width would violate the design rules of this process. Since Equation 1 is independent of the integrated circuit process for which it is choosing transistor sizes, the size chosen in step 204 may need to be rounded to another size that meets the design rules of the process. For example, if step 204 produced a value of 1.15 um FET, and FET widths may only be adjusted in 0.1 um increments, the approximate FET width produced by Equation 1 would have to be rounded to either 1.1 um or 1.2 um. An example of this rounding for the sample discrete transistor sizes given in Table 1 is given in Table 2.

TABLE 2

| n | Rounded $4^{(\frac{2n}{6}-1)}$ to meet 0.1 size increment restriction |
|---|---|
| 0 | 0.3 |
| 1 | 0.4 |
| 2 | 0.6 |
| 3 | 1.0 |
| 4 | 1.6 |
| 5 | 2.5 |
| 6 | 4.0 |

However, if the fabrication (or design) process had no such restriction, or the size determined in step 204 met those restrictions, the rounding in step 206 would not be necessary and step 206 might be eliminated.

What is claimed is:

1. A method for choosing transistor sizes in a circuit optimization program, comprising:
   selecting a discrete integer index wherein said integer index is selected from a range of integers from and including first value to and including a second value;
   determining an adjusted transistor size from said integer index wherein a set of adjusted transistor sizes generated from a set of indexes ranging from said first value to said second value are approximately exponentially distributed from a first transistor size to a second transistor size.

2. The method of claim 1, wherein said first transistor size corresponds to said integer index having said first value and said second transistor size corresponds to said integer index having said second value.

3. The method of claim 1, wherein an initial integer index value corresponds to a starting transistor size and there are an equal number of integers from said first value to said initial integer index value and from said initial integer index value to said second value.

4. The method of claim 1 wherein there are a total of s integers between and including said first value and said second value and said set of adjusted transistor sizes are determined approximately from the formula $$W = A \cdot R^{\left(\frac{2n}{s-1}-1\right)}$$

wherein W is the approximate adjusted transistor size, A is a starting transistor size, R is a range factor that determines said first transistor size and said second transistor size, and n is said integer index value.

5. The method of claim 4 wherein said set of adjusted transistor sizes is generated by rounding said formula to meet a set of design rules.

6. The method of claim 1 wherein said adjusted transistor size is a FET width to length ratio.

7. The method of claim 1 wherein said adjusted transistor size is a bipolar transistor area.

8. A method of optimizing a circuit, comprising:
   adjusting a circuit parameter of a plurality of transistors;
   choosing adjusted values for said circuit parameter from a plurality of sets of adjusted values wherein each of said sets of adjusted values are approximately exponentially distributed around a respective starting parameter value.

9. The method of claim 8 wherein said sets of adjusted values each range from a first value to a second value and there are an equal number of members of said set of adjusted values from said first value to said starting parameter value and from said starting parameter value to said second value.

10. The method of claim 8 wherein there are a total of s members of one of said sets of adjusted values and said one of said sets of adjusted values are determined approximately from the formula $$W = A \cdot R^{\left(\frac{2n}{s-1}-1\right)}$$

wherein W is an approximate adjusted transistor size, A is said starting parameter value, R is a range factor that determines a smallest member of said one of said sets of adjusted values and a largest member of said one of said sets of adjusted values and n is an integer index value that is varied between zero and s−1 to generate said one of said sets of adjusted values.

11. The method of claim 10 wherein said one of said sets of adjusted values is generated by rounding said formula to meet a set of design rules.

12. The method of claim 11 wherein said adjusted values represent FET width to length ratios.

13. The method of claim 11 wherein said adjusted values represent bipolar transistor areas.

14. A program storage medium readable by a computer, tangibly embodying a program of instructions executable by the computer to perform method steps for optimizing electronic circuits, said method steps comprising:

selecting a discrete integer index wherein said integer index is selected from a range of integers from and including first value to and including a second value;

determining an adjusted transistor size from said integer index wherein a set of adjusted transistor sizes generated from a set of indexes ranging from said first value to said second value are approximately exponentially distributed from a first transistor size to a second transistor size.

15. The program storage medium of claim 14, wherein said first transistor size corresponds to said integer index having said first value and said second transistor size corresponds to said integer index having said second value.

16. The program storage medium of claim 14, wherein an initial integer index value corresponds to a starting transistor size and there are an equal number of integers from said first value to said initial integer index value and from said initial integer index value to said second value.

17. The program storage medium of claim 14 wherein there are a total of s integers between and including said first value and said second value and said set of adjusted transistor sizes are determined approximately from the formula $$W = A \cdot R^{\left(\frac{2n}{s-1}-1\right)}$$

wherein W is the approximate adjusted transistor size, A is a starting transistor size, R is a range factor that determines said first transistor size and said second transistor size, and n is said integer index value.

18. The program storage medium of claim 17 wherein said set of adjusted transistor sizes is generated by rounding said formula to meet a set of design rules.

19. The program storage medium of claim 14 wherein said adjusted transistor size is a FET width to length ratio.

20. The program storage medium of claim 14 wherein said adjusted transistor size is a bipolar transistor area.

21. A program storage medium readable by a computer, tangibly embodying a program of instructions executable by the computer to perform method steps for optimizing electronic circuits, said method steps comprising:

adjusting a circuit parameter of a transistor;

choosing adjusted values for said circuit parameter from a set of adjusted values wherein each of adjusted values are approximately exponentially distributed around a starting parameter value.

22. The program storage medium of claim 21 wherein said adjusted values range from a first value to a second value and there are an equal number of members of said set of adjusted values from said first value to said starting parameter value and from said starting parameter value to said second value.

23. The program storage medium of claim 21 wherein there are a total of s members of said set of adjusted values and said set of adjusted values are determined approximately from the formula $$W = A \cdot R^{\left(\frac{2n}{s-1}-1\right)}$$

wherein W is an approximate adjusted transistor size, A is said starting parameter value, R is a range factor that determines a smallest member of said set of adjusted values and a largest member said set of adjusted values, and n is an integer index value that is varied between zero and s−1.

24. The program storage medium of claim 23 wherein said one of said sets of adjusted values is generated by rounding said formula to meet a set of design rules.

25. The program storage medium of claim 21 wherein said adjusted values represent FET width to length ratios.

26. The program storage medium of claim 21 wherein said adjusted values represent bipolar transistor areas.

* * * * *